United States Patent
Hershkovitz

(10) Patent No.: US 11,361,136 B2
(45) Date of Patent: Jun. 14, 2022

(54) CREATING MULTIPLE USE TEST CASE

(71) Applicant: International Business Machines Corporation, Armonk, NY (US)

(72) Inventor: Oz Dov Hershkovitz, Zichron Yaacov (IL)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 16/932,669

(22) Filed: Jul. 17, 2020

(65) Prior Publication Data

US 2022/0019721 A1 Jan. 20, 2022

(51) Int. Cl.
*G06F 30/3323* (2020.01)
*G06F 11/36* (2006.01)

(52) U.S. Cl.
CPC ...... *G06F 30/3323* (2020.01); *G06F 11/3684* (2013.01)

(58) Field of Classification Search
CPC .......................... G06F 30/3323; G06F 11/3684
See application file for complete search history.

(56) References Cited

U.S. PATENT DOCUMENTS

| | | | |
|---|---|---|---|
| 9,858,371 B1 * | 1/2018 | Ovadia | G06F 30/367 |
| 10,325,048 B1 * | 6/2019 | Chillarige | G06F 30/3323 |
| 10,534,881 B2 | 1/2020 | Schieve | |
| 11,163,675 B1 * | 11/2021 | Pearson | G06F 11/3676 |
| 2008/0189528 A1 | 8/2008 | Robinson | |
| 2008/0255822 A1 | 10/2008 | Adir | |
| 2015/0170764 A1 * | 6/2015 | Budhabhatti | G06F 13/385 714/718 |
| 2015/0310159 A1 * | 10/2015 | Raghavan | G06F 30/398 716/112 |
| 2016/0048629 A1 * | 2/2016 | Sotnikov | G06F 30/398 716/122 |
| 2016/0063744 A1 | 3/2016 | Freeman | |
| 2021/0346458 A1 * | 11/2021 | Widgerow | A61K 38/08 |
| 2021/0349749 A1 * | 11/2021 | Guha | G06F 9/45558 |

* cited by examiner

*Primary Examiner* — Stacy Whitmore

(74) *Attorney, Agent, or Firm* — Alexander G. Jochym

(57) ABSTRACT

An approach to create a multiple use test case when one or more computer processors receive a first test case from a test generator. The approach includes the computer processors evaluating each instruction in the first test case to determine that an instruction meets a set of conditions for creating a multiple use test case. The method includes one or more computer processors generating a set of rules for each instruction meeting the one or more conditions to create the multiple use test case. Furthermore, the method includes one or more computer processors creating the multiple use test case by adding the set of rules to each instruction meeting the one or more conditions to create the multiple use test case.

17 Claims, 4 Drawing Sheets

CREATING MULTIPLE USE TEST CASE

BACKGROUND

The present invention relates generally to the field of processor design verification, and more particularly to the use of test cases for design verification.

Test program generators are sophisticated software engines that are usually used to create a number of test cases to be executed by the processor implementation under test. Generally, a test case is a file of the initializations and instructions for the test. Typically, the initializations include memory locations and registers associated with the instructions along with a predicted result or output of the test case. While the method used to generate an individual test case may vary, once created the test case is static. Except for a few special situations when there is timing involved or when asynchronous events occur, in general, a test case, once generated with a full list of the initializations for running the test case, remains constant and unchanged, resulting in the same results each time the test case is run through simulation.

SUMMARY

Aspects of an embodiment of the present invention disclose a method, computer program product, and computer system to create multiple use test case. The method includes one or more computer processors receiving a first test case from a test generator. The method includes one or more computer processors evaluating each instruction in the first test case to determine that an instruction meets a set of conditions for creating a multiple use test case. The method includes one or more computer processors generating a set of rules for each instruction meeting the one or more conditions to create the multiple use test case. Furthermore, the method includes one or more computer processors creating the multiple use test case by adding the set of rules to each instruction meeting the one or more conditions to create the multiple use test case.

DETAILED DESCRIPTION

Figure 1:
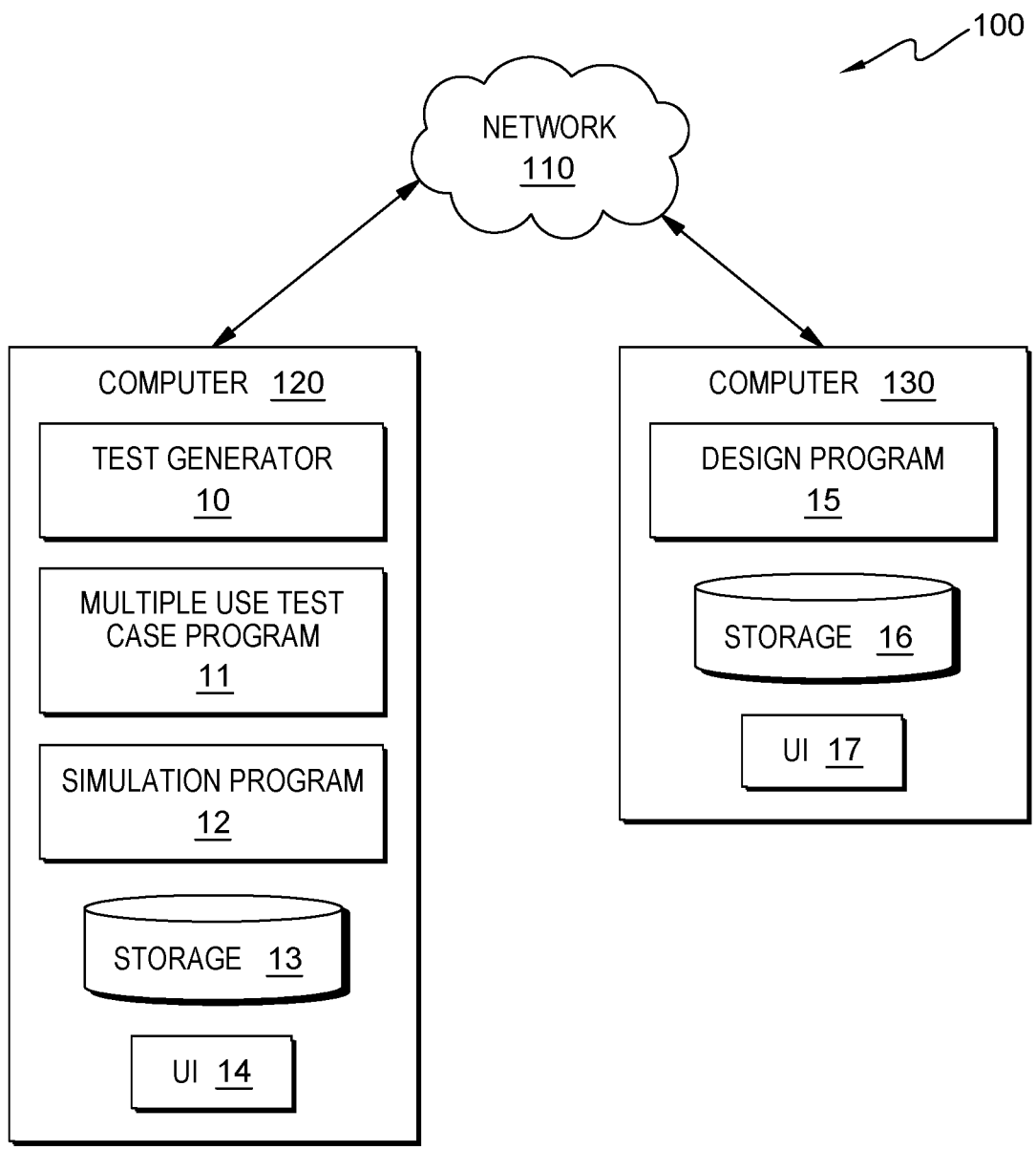
FIG. 1 depicts a functional block diagram of a computing environment suitable for operation of a multiple test case generator program, in accordance with at least one embodiment of the invention.

Embodiments of the present invention recognize that when a test generator program creates a test case, the test case is static. The test case is typically composed of the instructions and initializations used to run the test case along with an expected outcome of the test case Embodiments of the present invention recognize that a test case, as currently generated, when run cannot provide any randomness since the initialization values, from memory or registers, are fixed values. Embodiments of the present invention recognize that resources and time are used in the generation of a test case and for this reason, it is desirable to re-use a generated test case. Additionally, embodiments of the present invention recognize that an ability to run a number of tests with a number of different input values would be desirable to improve the robustness of the testing of a design or processor implementation.

Embodiments of the present invention provide a method, a computer program, and a computing system enabling a post process test generation program to modify a conventionally generated test case so that the original test case can become a multiple use test case. A multiple use test case can be run many times to create a new test case with different inputs or initialization values and outputs each time the multiple test case is run. The new test cases provide a different but, allowable outputs since each new test case, generated using the multiple use test case, behaves in a same manner as the original test case during simulation.

Embodiments of the present invention provide a multiple use test case generated from a conventionally generated test case. The multiple use test case includes a template or a set of rules that replace or be added to an instruction in the original test case when the instruction meets a number of conditions. After a set of rules are added to each instruction that meets the required conditions in the original test, a multiple use test case is generated. The determined set of rules can change initialization values or inputs in a memory location or register of the original test case each time the multiple use test case is run. In this manner, the original, conventionally generated, test case is modified to create a multiple use test case. Embodiments of the present invention, using the set of determined rules as a template in the multiple use test case, changes the inputs to specific qualified instructions as long as the set of rules in the template ensure that the qualified instruction behaves the same as the original test case in simulation. A qualified instruction, in embodiments of the present invention, is an instruction that meets the conditions included within a multiple use test case program for direct instruction inputs and direct instruction outputs.

Embodiments of the present invention provides a multiple use test case program that includes the set of conditions for qualifying an instruction in the original test case. Once an instruction is qualified, the multiple use test case program determines set of rules to replace or modify the qualified instruction in the original test case. A unique set of rules can be generated for each qualified instruction. When each set of rules modifies each qualified instruction, the multiple use test case program creates the multiple use test case. Each time the multiple test case program executes the multiple use test case, new initialization values that replace initialization values in a resource such as, a memory location or a register, in the original test case are generated for new test cases.

Embodiments of the present invention provide a method of creating a multiple use test case where each of the new test cases generated by the multiple use test case will behave in the same manner as the original test case. The template with the set of rules that replace one or more initialization values associated with a qualified instruction in a register or memory location are determined by a problem-solving tool or constraint solving tool executing within the multiple use test case program. The set of rules are determined such that when the new initialization values are generated for the memory location or register, the generated initialization values consistently provide a valid test and the test is different every time the multiple use test case is run.

In this way, embodiments of the present invention, change a single, conventionally generated test case into a multiple use test case using the multiple use test case program that determines both when an instruction in the original test case can be modified and a set of rules that can modify or replace the qualified instruction.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The present invention will now be described in detail with reference to the Figures.

FIG. 1 depicts a functional block diagram of a computing environment 100 suitable for operation of multiple use test case (MUTC) program 11 in accordance with at least one embodiment of the invention. FIG. 1 provides only an illustration of one implementation and does not imply any limitations with regard to the environments in which different embodiments may be implemented. Implementation of embodiments of the invention may take a variety of forms, and exemplary implementation details are discussed subsequently with reference to the Figures. Many modifications to the depicted environment may be made by those skilled in the art without departing from the scope of the invention as recited by the claims.

As depicted, FIG. 1 illustrates one possible embodiment of MUTC program 11 in computer environment 100 where MUTC program 11 executes on computer 120 with test generator 10, simulator program 12, storage 13, and user interface (UI) 14. MUTC program 11 is connected over network 110 to computer 130 with design program 15. In other embodiments, design program 15 may reside on computer 120. Similarly, in some embodiments, each of MUTC program 11, test generator 10, simulator program 12 and design program 15 may each reside on a different computer with each computer (not depicted in FIG. 1) connected over network 110.

Network 110 can include, for example, wireless local area network (WLAN), a telecommunications network, a local area network (LAN), a virtual LAN (VLAN), a wide area network (WAN), such as the Internet, a localized wireless communication network, such as near-field communication (NFC) network, or a combination of the these, where network 110 can include both wired or wireless connections. In an embodiment, computing environment 100 is a cloud computing environment. In general, the network can be any combination of wired, wireless, or optical connections and protocols that will support communications between computer 120 and computer 130, and other computing devices (not shown) within computing environment 100.

Computer 120 is depicted as including test generator 10, MUTC program 11, simulation program 12, storage 13, and UI 14. In some embodiments, computer 120 can be a desktop computer, a notebook computer, a server, a blade server, a mainframe computer, a laptop computer, a tablet computer, a netbook computer, or any other programmable electronic computing device capable of receiving, sending, and processing data, and communicating with features and functions of computer 130, and other computing devices (not shown) within distributed data processing environment 100 via network 110. In another embodiment, computer 120 represents a computing system utilizing clustered computers and components (e.g., database server computers, application server computers, etc.) that act as a single pool of seamless resources when accessed within distributed data processing environment 100. Computer 120 may include internal and external hardware components, as depicted in more detail and described in FIG. 4.

Test generator 10 can be any known test generator program capable of receiving design data, such as processor design data, and generating a test case according to commonly used test case generation methods known to one skilled in the art. While depicted as residing on computer 120, in other embodiments, test generator 10 may reside computer 130 or a one or more computer not depicted in FIG. 1. In various embodiments, test generator 10 receives a command, from a user on either of UI 14 or UI 17, to generate a multiple use test case from design data such as processor design data received from design program 15. In this case, test generator 10 sends a test case to MUTC program 11. Test generator 10 may send and receive data, such as design data or test cases, to and from computer 130, MUTC program 11, and simulator program 12.

In one embodiment, the computer code and computer instructions of MUTC program 11 is included in test generator 10. In this embodiment, MUTC program 11 is implemented within test generator 10. When MUTC program 11 is implemented in test generator 10, test generator 10 can create a multiple use test case from a conventionally generated test case by replacing one or more qualified instructions with a set of rules (e.g., a template). When test generator 10 with MUTC program 11 executes the set of rules in the multiple use test case to change initialization value(s) of each qualified instruction in one or more memory locations or one or more registers using the rules generated by MUTC program 11 in test generator 10.

MUTC program 11 is depicted as executing on computer 120. MUTC program 11 includes the computer programming code capable of creating a multiple use test case and a plurality of new test cases from a conventionally generated, static, test case. In various embodiments, MUTC program 11 receives an original test case from test generator 10. In these embodiments, MUTC program 11 is a post process that may execute after test case generation by test case generator 10. MUTC program 11 evaluates the instructions in the test case according to a set of pre-determined conditions, and when the conditions are met, MUTC program 11 generates a set of rules for a template for each instruction that meets the conditions. MUTC program 11 replaces or modifies each instruction that meets the conditions for creating the multiple use test with the corresponding set of determined rules. When the multiple test case is run by MUTC program 11, one or more inputs or initialization values in a register or memory location associated with each qualified instruction are changed. For purposes of the present invention, a set of is a set of one or more, such as, a set of one or more rules.

MUTC program 11 evaluates each instruction in a conventional test case to determine if a template (e.g., a set of rules) can be used to replace one or more initialization values in one or more registers or memory locations of the conventional or original test case. MUTC program 11 may replace initialization values in any qualified instruction. MUTC program 11 includes a multiple use test case generation tool capable of generating a plurality of new test cases using the set of rules in the multiple use test case.

The new test cases created from the multiple use test case by MUTC program 11 operate in the same manner as the original test case (e.g., provides no exceptions when the original test case provided no exceptions in simulation). The changes to an original test case, such as new initialization values in a register, are enabled as long as the changes create influence in a controlled manner. For example, the new test case is enabled to change the data for a single instruction, but the changed data cannot be data that is read or being used by another instruction the next time the changed data is accessed.

In various embodiments, MUTC program 11 transforms a conventional, fully initialized, test case with a single outcome or single output into a multiple use test case that can be run multiple times to create any number of unique test cases. Each of the new test cases generated from the multiple use test case by MUTC program 11 provide different input values for initialization. After executing each new test case on simulation program 12, each of the new test cases result in a different output while the new test case provide the same or similar behavior as the original test case in simulation. For example, if after simulation, the original test case resulted in a positive value for the output and no exceptions then, each of the new test cases would provide a positive value for the output with no exceptions after simulation. In some embodiments, MUTC program 11 stores each new test case in storage 13. MUTC program 11 is capable of sending and receiving data to and from test generator 10, simulation program 12, storage 13, UI 14, computer 130, and other computing devices (not depicted) in computer environment 100.

Simulation program 12 can be any one of known simulation tools or design simulation software programs used in design simulation and test. As known to one skilled in the art, simulation program 12 can receive, test and provide test case output for designs and/or design data, such as a processor design data, for design simulation and verification. In various embodiments, simulator program 12 receives a number of test cases generated by MUTC program 11. In these embodiments, simulator program 12 can run each of the test cases generated by MUTC program 11. Simulator program 12 can provide test case simulation output for each of the test cases generated by MUTC program 11. Simulator program 12 can receive test cases from MUTC program 11 and send simulation run outputs to storage 13.

Storage 13, as depicted, resides in computer 120. Storage 13 may store and retrieve an original test case conventional output from test generator 10, multiple use test cases that include a test template with rules generated by and received from MUTC program 11, each test case generated from a multiple use test case by MUTC program 11, design data received from computer 130, simulation data received from simulator program 12, and other any other data sent to storage 13 by any computer program or computing device in computer environment 100.

Computer 120 also includes UI 14. UI 14 provides the functionality commonly provided by user interfaces in computing devices such as by touch screens, display screens, keyboards, audio devices capable of receiving vocal inputs, etc. UI 14 enables a user of computer 120 to interact with MUTC program 11, test generator 10, simulator program 12, storage 13, computer 130, and any other computing devices and computer programs not shown in FIG. 1. For example, UI 13 may receive a user input of a number test cases to be generated by MUTC program 11.

Computer 130, as depicted, includes design program 15, storage 16, and UI 17. Computer 130 can be a desktop computer, a notebook computer, a server, a blade server, a mainframe computer, a laptop computer, a tablet computer, a netbook computer, or any other programmable electronic computing device capable of receiving, sending, and processing data, and communicating with features and functions of computer 120, and other computing devices (not shown) within distributed data processing environment 100 via network 110. In some cases, computer 130 represents a computing system utilizing clustered computers and components (e.g., database server computers, application server computers, etc.) that act as a single pool of seamless resources, as in a cloud computing environment, when accessed within distributed data processing environment 100. Computer 130 may send and receive data, such as processor design data, to and from computer 120 and other computing devices not depicted in computer environment 100. Computer 130 may include internal and external hardware components, as depicted in more detail and described in FIG. 4.

Design program 15 can be any available design program, such as a computer processor design program or software tool. While depicted in FIG. 1 as residing on computer 130, in another embodiment, design program 15 may reside on computer 120 or another computing device in computer environment 100. Design program 15 can be used to generate one or more processor designs or other functional hardware designs. Design program 14 may receive inputs, such as design or performance parameters from a user via UI 17 or from another program, computer, or data source (e.g., storage 16). Design program may send completed design data, such as one or more processor designs to storage 16 and/or to computer 120 (e.g., for design verification and test by programs, such test generator 10 and simulator program 12). In various embodiments, design program 15 receives a command to send design data to test generator 10 with a request to create a test case to send to MUTC program 11 in order to create a multiple use test case.

Storage 16, as depicted, resides in computer 130. Storage 16 may store and retrieve design related data included completed processor design data from design program 15, data received from computer 120, such as test cases or simulation data relating to designs, such as a processor or other functional hardware design (e.g., semiconductor chip or system), received simulation program 12, or any other data sent or requested by another program computing device (not depicted) in computer environment 100. Computer 130 also includes UI 17. UI 17 provides the functionality commonly provided by user interfaces in computing devices such as by touch screens, display screens, keyboards, audio devices capable of receiving vocal inputs, etc. UI 17 enables a user of computer 130 to interact with design program 15, storage 16, along with test generator 10, MUTC, simulator 12, storage 13 on computer 120, and any other computing devices and computer programs in computer environment 100 not shown in FIG. 1. For example, UI 17 may receive a user input of a request to send a processor design to test generator 10.

Figure 2:
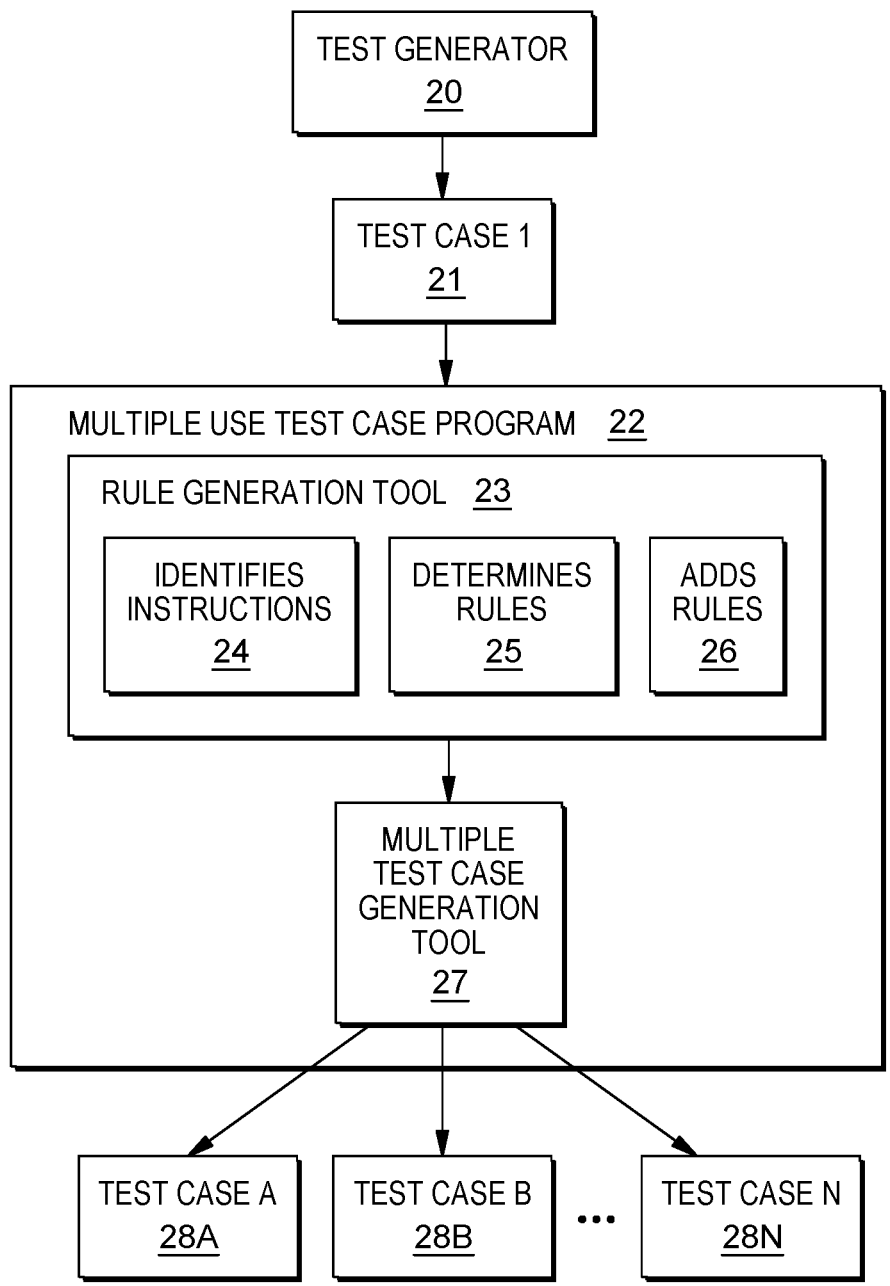
FIG. 2 is a block diagram of an example of operation of a multiple use test case program according to an embodiment of the present invention.

FIG. 2 is a block diagram of an example of operation of MUTC program 22 according to an embodiment of the present invention. MTUC program 22 is essentially the same program as MUTC program 11 in FIG. 1 (e.g., has the same computer code, providing the same functionally as MUTC program 11). Similarly, test generator 20 is essentially the same as test generator 10 in FIG. 1.

As depicted, FIG. 2 includes test generator 20, use test case 1 in block 21, MUTC program 22 which includes rule generation tool 23 and multiple test case generation tool 27, test case A in block 28A, test case B in block 28B through test case N in block 28N. Test generator 20 can generate test case 1, which is an original, conventionally generated test case. Test case 1 in block 21 can be input into MUTC program 22 where rule generation tool 23 in block 24 identifies instructions that meet the conditions of MUTC program 22 (e.g., inputs are uninitialized, output are unused or written). Rule generation tool 23 evaluates each instruction in test case 1 to determine if the instruction is qualified (e.g., meets the conditions for modification of the instruction). Rule generation tool 23 determines the rules, in block 25, that can modify the instructions that meet the conditions of MUTC program 22. When the rules are added to or in some cases, replace the instructions then, the new test case (e.g., test case A in block 28A) can provide a similar behavior as test case 1 in block 21 during simulation. Once rule generation tool 23 using block 25 determines the rules to replace a value in a memory location or register, then rule generation tool 23 adds the rules to the qualified instruction in block 26.

Rule generator tool 23 is a software tool that may use any one of several methods to determine a set of rules replacing a qualified instruction to create the multiple use test case. For example, rule generation tool 23 may use a constraint solver, a model used to generate the processor design, or other known rule generation method for identifying rules for MUTC program 22. Rule generator tool 23 creates a multiple use test case in block 26 by adding the rules to the memory location or register in the instruction. Multiple use test case generator tool 27 generates, in a stepwise or sequential manner, each of test case A in block 28A, test case B in block 28B, and test case N in block 28N from the multiple use test case (not depicted) where test case N can be any number of test cases based on a pre-programmed or received user input on UI 14. In the example depicted in FIG. 2, three test cases are generated by MUTC program 22 after rule generation tool 23 adds the rules to test case 1 however, in other examples any number of test cases may be generated by MUTC program 22.

The multiple use test case (not depicted), when executed by multiple use test case generation tool 27 in MUTC program 22, generates test case A, test case B, and test case N where each of test case A, test case B, and test case N replace at least one input value in at least one register or a memory location (e.g., provides at least one new input value that is different than the associated input value in original test case register or memory location). In various embodiments, MUTC program 22 uses the set of rules created by rule generation tool 23 in MUTC program 22 to generate new input values replacing input or initialization values in test case 1 depicted in block 21.

Figure 3:
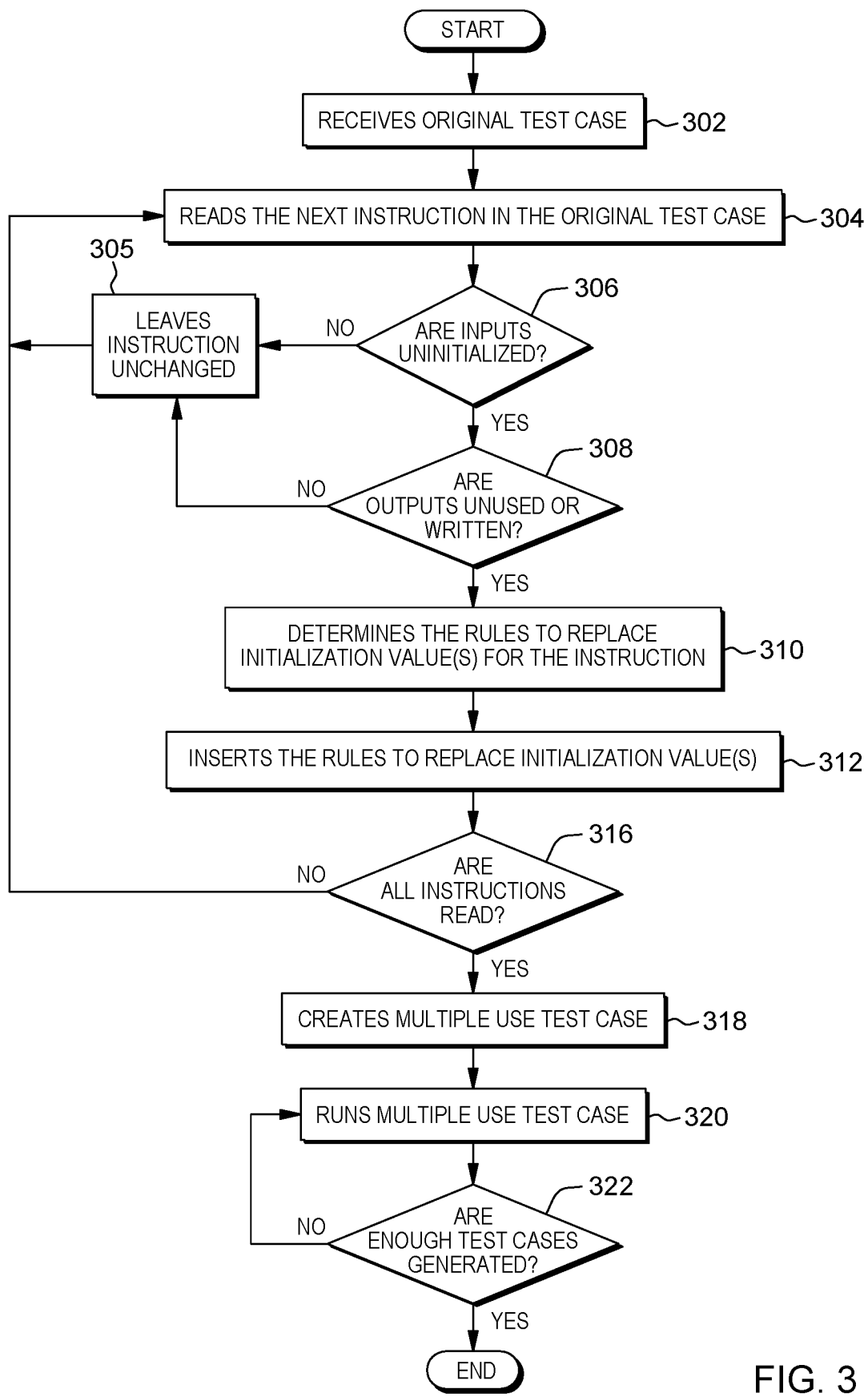
FIG. 3 is a flowchart depicting operational steps for the multiple use test case program with a random forest classifier according to an embodiment of the present invention.

FIG. 3 is a flowchart depicting operational steps for the MUTC program 11 according to an embodiment of the present invention. In an embodiment, the multiple use test case can be considered a template for creating any number of new test cases that behave similar to or in the same manner as the original test case generated by test generator 10.

In step 302, MUTC program 11 receives an original test case from test generator 10. Using conventional test case generation methods, test generator 10 generates an original test case and sends the original test case to MUTC program 11. The original test case is a traditional test case with a full set of initializations. The original test case is static (e.g., not capable of running other input values as the original test case includes a full set of initialization values). In one embodiment, MUTC program 11 queries test generator 10 or storage 13 for a recently generated original test case at pre-determined time intervals or in response to a user input on UI 14.

In step 304, MUTC program 11 reads the next instruction in the original test case. MUTC program 11 may read the first instruction to check if the first instruction (i.e., a next instruction) in the original test case meets the conditions for creating a multiple use test case.

In decision step 306, MUTC program 11 determines whether the inputs are uninitialized for the instruction. Starting with a first instruction in the original test case, MUTC program 11 evaluates each instruction in the original test case using the set of conditions defined in MUTC program 11. The conditions are associated with instruction inputs and instructions outputs. The conditions ensure that new test cases generated by the multiple use test case behave in a similar manner or the same manner as the original test case when the test cases are run (e.g., cause no exceptions or flags that were not present after running the original test case).

The conditions for an input being read by the instruction include the input should be uninitialized or appear as uninitialized and additionally, the conditions include either the input is not used again or a next time the input to the instruction is used, the input should be written to. In some embodiments, the inputs may appear to be uninitialized when tools or software are using reloaded sequences to free resources and with reloading. In this case, the input is considered as uninitialized.

In step 305 (no branch of decision step 306), responsive to determining that the inputs are initialized, MUTC program 11 leaves the instruction unchanged. When the inputs are initialized, the instruction is not qualified or suitable for modification to create a multiple use test case. If an input is already initialized, the specified value is not changeable. For example, an instruction that is used by an earlier instruction would be considered initialized and not eligible for change (e.g., proceeds to step 305). Changing an initialized input, especially when solving multiple instructions in parallel, in certain specific circumstances, can work but, in general can be very complicated and problematic in most cases. For this reason, MUTC program 11 determines if an instruction is uninitialized.

In step 305, the instruction will not be modified with the addition of new rules and the input will remain as the specified value in the original test case. MUTC program 11 returns to step 304 to check a next instruction in the original test case.

In decision step 308 (yes branch of decision step 306), responsive to determining that the inputs are uninitialized, MUTC program 11 determines whether the outputs of the instruction are unused or written on the output's next use.

Responsive to determining that the outputs are used but, not written (no branch of decision step 308), in step 305, MUTC program 11 leaves the instruction unchanged. If an output is read or otherwise implemented in a next use, MUTC program 11 considers the instruction ineligible for modification (e.g., modification to the output may change the test case behavior by changing later inputs and outcomes). In this case, MUTC program 11 returns to step 304 and reads the next instruction in the original test case.

In step 310 (yes branch of decision step 308), responsive to determining that the outputs are unused or written when the output is next used, MUTC program 11 determines rules used to replace the input values of the instruction. If an output is unused in the original test case or if the output is written when the output is used next then, the instruction is considered qualified instruction and the instruction can be modified to create a multiple use test case. For example, when the instruction is qualified, MUTC program 11 can determine a set of rules to modify or replace the qualified instruction in the original test case. In this manner, the determined set of rules inserted in the qualified instruction can replace a qualified instruction's register or memory values (e.g., when the multiple use test case is run).

MUTC program 11 can use one of several methods to determine or generate a set of rules to used replace a specific input or initialization values in the original test file to create the multiple use test case. For example, a constraint solver or a set of fixed rules per instruction could be used to determine the set of rules inserted or replacing the qualified instruction. The rules generated by MUTC program 11 can generate new input values in a new test case to replace the values in a register or memory for an instruction in the original test case when the multiple use test case is run.

Another example of a method of creating a set of one or more rules that can transform the original test case (e.g., a static test) into a multiple use test case would be to use the same model that was used to generate the original test case. In this case, the model would hold the dependencies and desired behavior of the candidate instruction (e.g., an instruction that is uninitialized and with outputs that are unused or written in the next usage).

In a very simple example, an add instruction may be dependent on the two add inputs and be sensitive to some setting in other registers. If the add instruction passes decision steps 306 and 308 (yes branches) then, the model can generate rules that allow MUTC program 11 to generate different values for the two inputs that allow the multiple use test case to behave like the original test case but with different inputs and a different output.

For example, when an integer add instruction has passed both decision steps 306 and 308 with a positive or "yes" result then, changing both of the integer add inputs and the integer add output can be allowed according to MUTC program 11. In this case, a wide range of values can replace the integer add input values in the registers such that the integer add instruction will behave the same.

More specifically, in this example, address 1000 in memory has the add instruction "add GPR4, GPR2, GPR 3" where GPR2 is 0x10101010 and GPR3 is 0x01010101. GPR is a general-purpose register. In this example, address 1000 in memory holds the binary that can produce an add instruction. The instruction can take the value in GPR 2 and GPR3, sum the two values and places the result (e.g., summation) in GPR4. If the original input values for GPR 2 and GPR 3 produced a positive result flag with no exception then, the input values provided in a test case generated from the multiple use test case should also produce a positive result flag. In other words, the sum of the new values for GPR2 and GPR3 generated by the rules in address 1000 in memory is a positive number or a positive integer and no exception is generated when a simulation is run. In this case, the rules generated by rule generator tool 23 in MUTC program 11 can provide a test case from the multiple use test case that behaves like the original test case leaving the same marks. The rule generator tool 23 can generate a set of rules that create new, different input values and different output values than the original test case. The new test cases can behave in simulation as if the new input values were run in the original test case (e.g., a positive flag and no exceptions) while the new inputs provide a different output.

In step 312, MUTC program 11 inserts the rules to replace the initialization value(s). The set of rules may replace or modify the instruction (i.e., a qualified instruction). In various embodiments, MUTC program 11 replaces an input value or input values in a register using the set of rules when the multiple use test case is run in step 320. In this way, the set of rules can modify a qualified instruction in the original test case so that the new, multiple use test case provides different input values to the instructions during a test run. The set of rules can provide new test cases with different inputs in a test run (e.g., simulation) and different outputs. In this way, the multiple use test case uses the set of rules to change one or more specific initialization value or values and output while providing the same behavior during a simulation as that of the original test case (e.g., with no exceptions when the original test case runs without exceptions).

In decision step 316, MUTC program 11 determines whether all the instructions have been read. If all of the instructions in the original test case have not been read (no branch of decision step 316) then, MUTC program 11 returns to step 304 to read the next instruction in the original test case. However, when all of the instructions in the original test case have been read, in step 318 (yes branch of decision step 316), MUTC program 11 runs the multiple use test case. Once all of the instructions have been read and rules have been generated to replace specific inputs in one or more registers or memory locations, the multiple use test case is generated.

In step 318 (yes branch of decision step 316), MUTC program 11 creates a multiple use test case. Once all of the instructions in the original test case have been read and completed steps 306 through 312, the multiple use test case is completed. Rules have been added to each qualified instruction, and MUTC program 22 generates the multiple use test case.

In another slightly more complicated example of an original test case, where G indicates a register and initialization values for three registers are G3 is 0x12345678, G4 is 0x10101010, and G5 is 0x01010101.

In this example, original test case 1 instructions in block 21 of FIG. 2 are as follows: Sub G8, G6, G7 where this instruction subtracts G7 from G6 and places the result in G8; Add G3, G4, G5 where this instruction adds G4 and G5, placing the result in G3; Ld G3←1000(G7) where this instruction takes the value from the address generated from adding 1000 to G7 and places the value in G3; Add G5, G3, G9 where this instruction adds G3 and G9 and places the result in G3; and St G3→200(G9), where the value of G3 is placed at the memory location determined by adding 2000 and G9.

When evaluating if the conditions to create the multiple use test case are met, MUTC program 22 determines that instructions Sub G8, G6, G7, Ld G3<–1000(G7) and Add G5, G3, G9 do not meet the conditions of decision steps 306 and 308. Instruction Sub G8, G6, G7 does not meet the conditions decision steps 306 and 308 since input G7 is being read by instruction Ld G3<–1000(G7). In this case, changing the value of G7 will make the entire test invalid. Instruction Ld G3<–1000(G7) fails to meet the conditions of decision steps 306 and 308 because G7 is being read by instruction and therefore, G7 is initialized. Instructions Add G5, G3, G9 and St G3→200(G9) fail to meet the conditions of decision steps 306 and 308 because instruction Add G5, G3, G9 and (St G3→200(G9) input G9 and no instruction can change G9.

However, instruction Add G3, G4, G5 meets the conditions of decision steps 306 and 308 because input G4 is not used in the test, input G5 is being written by instruction Add G5, G3, G9 and G3 is an output that is being written in G3's next use. Therefore, instruction Add G3, G4, G5 meets the conditions to modify or replace the instruction with rules to create a multiple use test case according to MUTC program 11.

When using instruction Add G3, G4, G5 in the original test case above, adding the values of G4 and G5 would result in a value of 0x11111111. Assuming that specific architecture of the original test case raises a flag for a positive result and no exception is detected then, every combination of inputs in G4 and G5 in new test cases generated from a multiple use test case results in a positive flag (e.g., a positive result) with no exceptions and each new test case with different input values (e.g., initialization values) will work and behave like the original test case.

If MUTC program 11, uses rule generation tool 23 with a constraint model then, an example of the constraints for the instruction could be generated include a rule that a positive result occurs when the new test case is run and assuming the specific architecture of the original test case also has overflow detection then, a no overflow rule or constraint could be included. The set of rules, in this example, could be G4+G5>0x00000000 (e.g., the result must be positive or greater than zero) and G4+G5<0x7FFFFFFF (e.g., no overflow exception allowed, assuming the first bit is a sign bit and where 0x7FFFFFFF is a maximum hexadecimal number). Another constraint that might be added could be G4+G5=G3 in order to calculate the new result. The additional constraint can be necessary if the predicted results are used in the verification process, otherwise the new value of G3 could be masked. These constraints may be added to instruction Add G3, G4, G5 to determine a new G3. The new G3 can be determined using the rules added for G4 and G5 where G4+G5>0x00000000 and G4+G5<0x7FFFFFFF are added in to instruction (e.g., Add G3, G4, G5) to determine possible new values for G4 and G5 in a new test case that will provide a positive result and no overflow exception during simulation test of the new test case generated by MUTC program 11.

Another way of writing the numeric constraints for the set of rules above could be a first rule or constraint is I1+I2>0x00000000, a second rule is I1+I2<0x7FFFFFFF, and a third rule t is I1+I2=O1, where I is an input and O is an output. The first rule checks that the result is positive. The second rule verifies that there is no overflow condition. The third rule calculates the new result for G3.

Using the above method in MUTC program 11 creates a multiple use test by replacing instruction Add G3, G4, G5 with the rules above (e.g., I1+I2>0x000000000, I1+I2<0xF7777777, and I1+I2=O1) determined by MUTC program 11 as a set of rules (e.g., I1+I2>0x000000000, I1+I2<0xF7777777, and I1+I2=O1 in the original test. Each time the multiple use test case is run (e.g., by multiple test generator tool 27 depicted in FIG. 2) by MUTC program 11 to generate a new test case with a new set of input values replacing G4 and G5 in the original test case, the new test case when run in simulation provides output values with a positive flag and without an exception. This multiple use test can be run multiple times using the set of rules to replace G3, G4 and G4 in the original test case 1.

In step 320, MUTC program 11 using multiple test case generator tool 27 depicted in FIG. 2, runs the multiple use test case resulting in a new test case, such as test case A in block 28A of FIG. 2. Each time MUTC program 11 executes using multiple test case generator tool 27, another test case is generated from the multiple use test case. As previously discussed above, each test case generated by MUTC program 11 from the multiple use test case can provide different input values resulting in a same test outcome as the original test case, such as a positive value and no exceptions.

In decision step 322, MUTC program 11 determines whether enough test cases have been generated. MUTC program 11 can be pre-programmed with one of several different methods of determining if a sufficient number of test cases have been created. For example, MUTC program 11 may include a pre-set number of desired test cases, a pre-determined amount of time to generate new test cases from the multiple use test case, a tracker that determines when the number of test cases matches a pre-determined number of test cases generated from the multiple use test case, etc. Responsive to determining that enough test cases have not been generated (no branch of decision step 322) then, MUTC program 11 returns to step 320 to run another test case. In the depicted embodiment, when MUTC program 11 has determined that enough test cases have been run (yes branch of decision step 322) then, MUTC program 11 ends.

In some embodiments, MUTC program 11 includes the instructions to send each of the pre-set number of test cases and the original test case to simulator program 12 for simulation. In these embodiments, MUTC program 11 also includes instructions to retrieve from simulator program 12 the results of the simulation of the pre-set number of test cases and the original test. MUTC program 11 verifies that simulation results are similar to or the same as the original test case simulation results. For example, if the original test case simulation results in a positive flag (e.g., a positive output) and no exceptions then, the simulation of each of the pre-set number of test cases results in a positive flag and no exceptions. In one embodiment, the instructions and code of MUTC program 11 is included in simulator program 12.

To summarize the steps of FIG. 3, MUTC program 11 determines if a set of conditions are met for each instruction in an original test. When the set of conditions are met then, MUTC program 11 generates a multiple use test case that can be used many times to create any number of new test cases with different input values that result in different output values where, each of the new test cases generated by MUTC program 11 behaves in the same manner as the original test case. In other words, each new test case generated by MUTC program 11 from the multiple use test does not cause an exception or a flag that did not occur during the run of the original test case.

Figure 4:
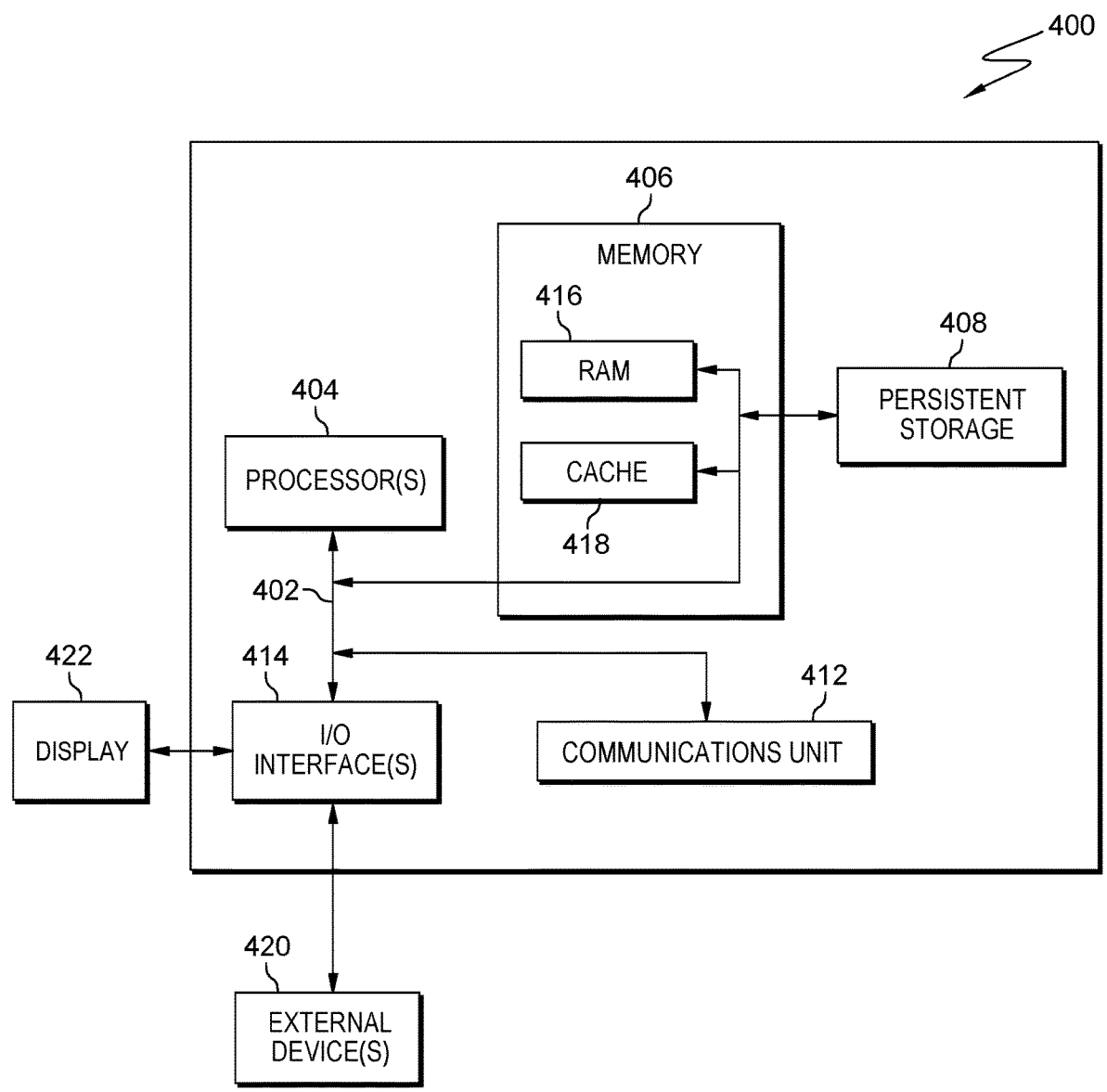
FIG. 4 is a block diagram depicting components of a computer system suitable for executing the multiple use test case program with a modified long short-term memory algorithm according to an embodiment of the present invention.

FIG. 4 is a block diagram depicting components of a computer system suitable for executing MUTC program 11 and MUTC program 22 according to an embodiment of the present invention. FIG. 4 displays the computer system 400, one or more processor(s) 404 (including one or more computer processors or central processor units), a communications fabric 402, a memory 406 including, a RAM 416, and a cache 418, a persistent storage 408, a communications unit 412, I/O interfaces 414, a display 422, and external devices 420. It should be appreciated that FIG. 4 provides only an illustration of one embodiment and does not imply any limitations with regard to the environments in which different embodiments may be implemented. Many modifications to the depicted environment may be made.

As depicted, the computer system 400 operates over the communications fabric 402, which provides communications between the computer processor(s) 404, memory 406, persistent storage 408, communications unit 412, and input/output (I/O) interface(s) 414. The communications fabric 402 may be implemented with an architecture suitable for passing data or control information between the processors 404 (e.g., microprocessors, communications processors, and network processors), the memory 406, the external devices 420, and any other hardware components within a system. For example, the communications fabric 402 may be implemented with one or more buses.

The memory 406 and persistent storage 408 are computer readable storage media. In the depicted embodiment, the memory 406 comprises a random-access memory (RAM) 416 and a cache 418. In general, the memory 406 may comprise any suitable volatile or non-volatile one or more computer readable storage media.

Program instructions for MUTC program 11 may be stored in the persistent storage 408, or more generally, any computer readable storage media, for execution by one or more of the respective computer processors 404 via one or more memories of the memory 406. In an embodiment, program instructions for MUTC program 11 may be stored in memory 406. The persistent storage 408 may be a magnetic hard disk drive, a solid-state disk drive, a semiconductor storage device, read only memory (ROM), electronically erasable programmable read-only memory (EEPROM), flash memory, or any other computer readable storage media that is capable of storing program instruction or digital information.

The media used by the persistent storage 408 may also be removable. For example, a removable hard drive may be used for persistent storage 408. Other examples include optical and magnetic disks, thumb drives, and smart cards that are inserted into a drive for transfer onto another computer readable storage medium that is also part of the persistent storage 408.

The communications unit 412, in these examples, provides for communications with other data processing systems or devices. In these examples, the communications unit 412 may comprise one or more network interface cards. The communications unit 412 may provide communications through the use of either or both physical and wireless communications links. In the context of some embodiments of the present invention, the source of the various input data may be physically remote to the computer system 400 such that the input data may be received, and the output similarly transmitted via the communications unit 412.

The I/O interface(s) 414 allow for input and output of data with other devices that may operate in conjunction with the computer system 400. For example, the I/O interface 414 may provide a connection to the external devices 420, which may be as a keyboard, keypad, a touch screen, or other suitable input devices. External devices 420 may also include portable computer readable storage media, for example thumb drives, portable optical or magnetic disks, and memory cards. Software and data used to practice embodiments of the present invention may be stored on such portable computer readable storage media and may be loaded onto the persistent storage 408 via the I/O interface(s) 414. The I/O interface(s) 414 may similarly connect to a display 422. The display 422 provides a mechanism to display data to a user and may be, for example, a computer monitor.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disk read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adaptor card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, though the Internet using an Internet Service Provider). In some embodiments, electronic circuitry including, for example programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram blocks or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of computer program instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method to create a multiple use test case, the computer-implemented method comprising:
   receiving, by one or more computer processors, a first test case from a test generator;
   evaluating, by one or more computer processors, each instruction in the first test case to determine that an instruction meets one or more conditions to create a multiple use test case;
   determining, by one or more computer processors, that each input to the instruction is uninitialized and each input is either not used again or written to a next time each input is used;
   determining, by one or more computer processors, that each output of the instruction is either not used or written to the next time each output is used, each output is written to;
   generating, by one or more computer processors, a set of rules for each instruction meeting the one or more conditions to create the multiple use test case; and
   creating, by one or more computer processors, the multiple use test case by adding the set of rules to each instruction meeting the one or more conditions to create the multiple use test case.

2. The computer-implemented method of claim 1, further comprises:
   running, by one or more computer processors, the multiple use test case to generate of a pre-determined number of test cases from the multiple use test case; and
   verifying, by one or more computer processors, that each test case of the pre-determined number of test cases behaves in simulation in a same manner as the first test case.

3. The computer-implemented method of claim 2, wherein each test case of the pre-determined number of test cases generated from the multiple test case has one or more different initialization values and one or more different outputs than the first test case.

4. A computer-implemented method of claim 2, wherein verifying that each test case of the pre-determined test cases behaves in simulation in the same manner as the first test case includes, at least, verifying that each test case of the pre-determined test cases provides no exceptions after simulation when the first test case provides no exceptions after the simulation.

5. A computer-implemented method of claim 1, wherein generating the set of rules for each instruction meeting the one or more conditions to create the multiple use test case further comprises:
   executing, by one or more computer processors, the set of rules in the multiple use test case replaces one or more initialization values in one or more memory location or one or more registers of the first test wherein, the set of rules in the multiple use test case are executed a plurality of times generating a plurality of test cases.

6. A computer-implemented method of claim 1, wherein determining that each input to the instruction is uninitialized includes determining that a reloaded instruction meets the one or more conditions to create the multiple use test case.

7. A computer program product comprising:
   one or more computer readable storage media and program instructions stored on the one or more computer readable storage media, the program instructions executable by a processor, the program instructions comprising instructions for:
   receiving, by one or more computer processors, a first test case from a test generator;
   evaluating, by one or more computer processors, each instruction in the first test case to determine that an instruction meets one or more conditions to create a multiple use test case;
   determining, by one or more computer processors, that each input to the instruction is uninitialized and each input is either not used again or written to a next time each input is used;
   determining, by one or more computer processors, that each output of the instruction is either not used or written to the next time each output is used, each output is written to;

generating, by one or more computer processors, a set of rules for each instruction meeting the one or more conditions to create the multiple use test case; and creating, by one or more computer processors, the multiple use test case by adding the set of rules to each instruction meeting the one or more conditions to create the multiple use test case.

8. The computer program product of claim 7, further comprises:

running, by one or more computer processors, the multiple use test case to generate of a pre-determined number of test cases from the multiple use test case; and verifying, by one or more computer processors, that each test case of the pre-determined number of test cases behaves in simulation in a same manner as the first test case.

9. The computer program product of claim 8, wherein each test case of the pre-determined number of test cases generated from the multiple test case has one or more different initialization values and one or more different outputs than the first test case.

10. The computer program product of claim 8, wherein verifying that each test case of the pre-determined test cases behaves in simulation in the same manner as the first test case includes, at least, verifying that each test case of the pre-determined test cases provides no exceptions after simulation when the first test case provides no exceptions after the simulation.

11. The computer program product of claim 7, wherein generating the set of rules for each instruction meeting the one or more conditions to create the multiple use test case further comprises:

executing, by one or more computer processors, the set of rules in the multiple use test case replaces one or more initialization values in one or more memory location or one or more registers of the first test wherein, the set of rules in the multiple use test case are executed a plurality of times generating a plurality of test cases.

12. The computer program product of claim 7, wherein determining that each input to the instruction is uninitialized includes determining that a reloaded instruction meets the one or more conditions to create the multiple use test case.

13. A computer system comprising:
one or more computer processors;
one or more computer readable storage media;
program instructions stored on the one or more computer readable storage media for execution by at least one of the one or more processors, the program instructions comprising instructions to perform:
receiving, by one or more computer processors, a first test case from a test generator;

evaluating, by one or more computer processors, each instruction in the first test case to determine that an instruction meets one or more conditions to create a multiple use test case;

determining, by one or more computer processors, that each input to the instruction is uninitialized and each input is either not used again or written to a next time each input is used;

determining, by one or more computer processors, that each output of the instruction is either not used or written to the next time each output is used, each output is written to;

generating, by one or more computer processors, a set of rules for each instruction meeting the one or more conditions to create the multiple use test case; and creating, by one or more computer processors, the multiple use test case by adding the set of rules to each instruction meeting the one or more conditions to create the multiple use test case.

14. The computer system of claim 13, further comprises:
running, by one or more computer processors, the multiple use test case to generate of a pre-determined number of test cases from the multiple use test case; and verifying, by one or more computer processors, that each test case of the pre-determined number of test cases behaves in simulation in a same manner as the first test case.

15. The computer system of claim 14, wherein each test case of the pre-determined number of test cases generated from the multiple test case has one or more different initialization values and one or more different outputs than the first test case.

16. The computer system of claim 14, wherein verifying that each test case of the pre-determined test cases behaves in simulation in the same manner as the first test case includes, at least, verifying that each test case of the pre-determined test cases provides no exceptions after simulation when the first test case provides no exceptions after the simulation.

17. The computer system of claim 13, wherein generating the set of rules for each instruction meeting the one or more conditions to create the multiple use test case further comprises:

executing, by one or more computer processors, the set of rules in the multiple use test case replaces one or more initialization values in one or more memory location or one or more registers of the first test wherein, the set of rules in the multiple use test case can be executed a plurality of times generating a plurality of test cases.

* * * * *